United States Patent
Nagai et al.

(10) Patent No.: US 9,263,258 B2
(45) Date of Patent: Feb. 16, 2016

(54) METHOD FOR PRODUCING GROUP III NITRIDE-BASED COMPOUND SEMICONDUCTOR, WAFER, AND GROUP III NITRIDE-BASED COMPOUND SEMICONDUCTOR DEVICE

(75) Inventors: Seiji Nagai, Aichi (JP); Shiro Yamazaki, Aichi (JP); Takayuki Sato, Aichi (JP); Yasuhide Yakushi, Aichi (JP); Koji Okuno, Aichi (JP); Koichi Goshonoo, Aichi (JP)

(73) Assignee: TOYODA GOSEI CO., LTD., Nishikasugai-Gun, Aichi-Ken (JP)

( * ) Notice: Subject to any disclaimer, the term of this patent is extended or adjusted under 35 U.S.C. 154(b) by 1775 days.

(21) Appl. No.: 12/320,642

(22) Filed: Jan. 30, 2009

(65) Prior Publication Data

US 2009/0197118 A1    Aug. 6, 2009

(30) Foreign Application Priority Data

Feb. 1, 2008    (JP) .................................. 2008-23347

(51) Int. Cl.
| | |
|---|---|
| C30B 25/04 | (2006.01) |
| B32B 19/04 | (2006.01) |
| H01L 21/02 | (2006.01) |
| C30B 25/18 | (2006.01) |
| C30B 29/40 | (2006.01) |

(52) U.S. Cl.
CPC ............ H01L 21/0254 (2013.01); C30B 25/18 (2013.01); C30B 29/403 (2013.01); C30B 29/406 (2013.01); H01L 21/0242 (2013.01); H01L 21/02433 (2013.01); H01L 21/02458 (2013.01); H01L 21/02609 (2013.01); H01L 21/02639 (2013.01)

(58) Field of Classification Search
None
See application file for complete search history.

(56) References Cited

U.S. PATENT DOCUMENTS

| | | | |
|---|---|---|---|
| 2002/0197825 A1* | 12/2002 | Usui et al. ..................... | 438/459 |
| 2007/0057276 A1* | 3/2007 | Kiyoku et al. ................ | 257/103 |

FOREIGN PATENT DOCUMENTS

| | | | |
|---|---|---|---|
| JP | 2006-036561 | | 2/2006 |
| JP | 2006 036561 | * | 2/2006 |

* cited by examiner

*Primary Examiner* — Melvin C Mayes
*Assistant Examiner* — Colette Nguyen
(74) *Attorney, Agent, or Firm* — McGinn IP Law Group, PLLC.

(57) ABSTRACT

Provided is a method for producing a Group III nitride-based compound semiconductor having an M-plane main surface. The method employs a sapphire substrate having a main surface which is inclined by 30° with respect to R-plane about a line of intersection $L_{sapph-AM}$ formed by R-plane and A-plane perpendicular thereto. R-plane surfaces of the sapphire substrate are exposed, and a silicon dioxide mask is formed on the main surface of the substrate. AlN buffer layers are formed on the exposed R-plane surfaces. A GaN layer is formed on the AlN buffer layers. At an initial stage of GaN growth, the top surface of the sapphire substrate is entirely covered with the GaN layer through lateral growth. The GaN layer is grown so that the a-axis of the layer is perpendicular to the exposed R-plane surfaces of the sapphire substrate; the c-axis of the layer is parallel to the axis direction $L_{sapph-AM}$ of the sapphire substrate; and the m-axis of the layer, which is inclined by 30° from the a-axis thereof, is perpendicular to the main surface (inclined by 30° from the exposed R-plane surfaces) of the sapphire substrate.

20 Claims, 5 Drawing Sheets

FIG. 1. A
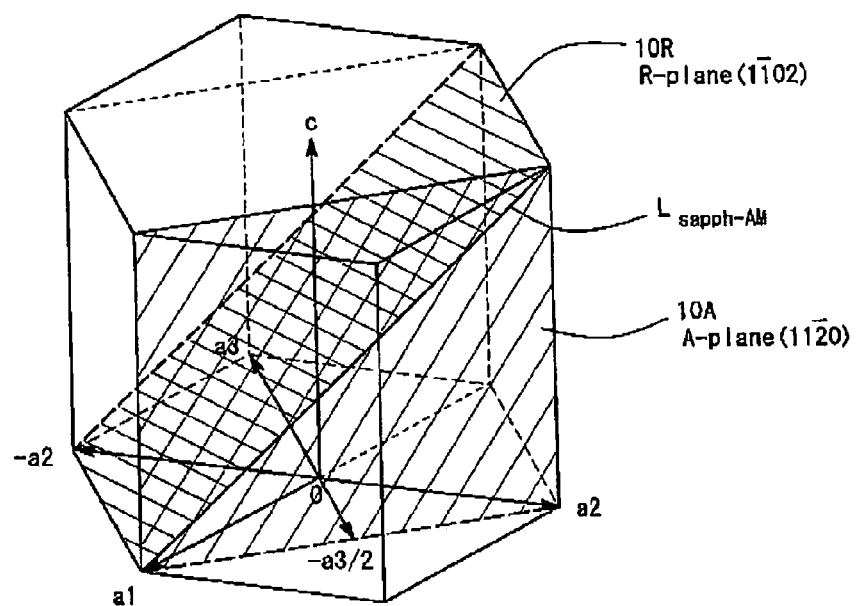

FIG. 1.B
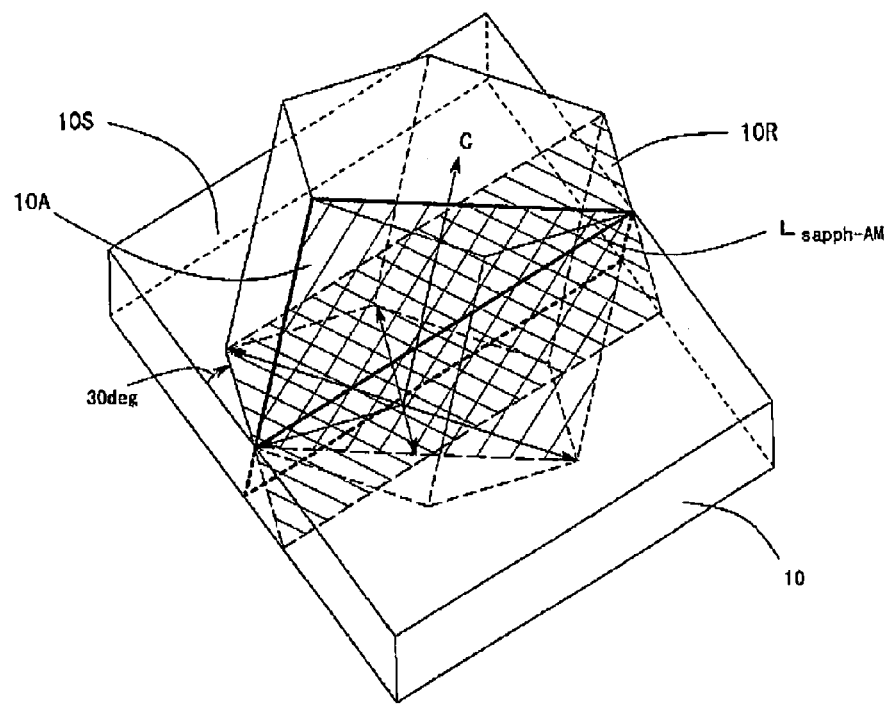

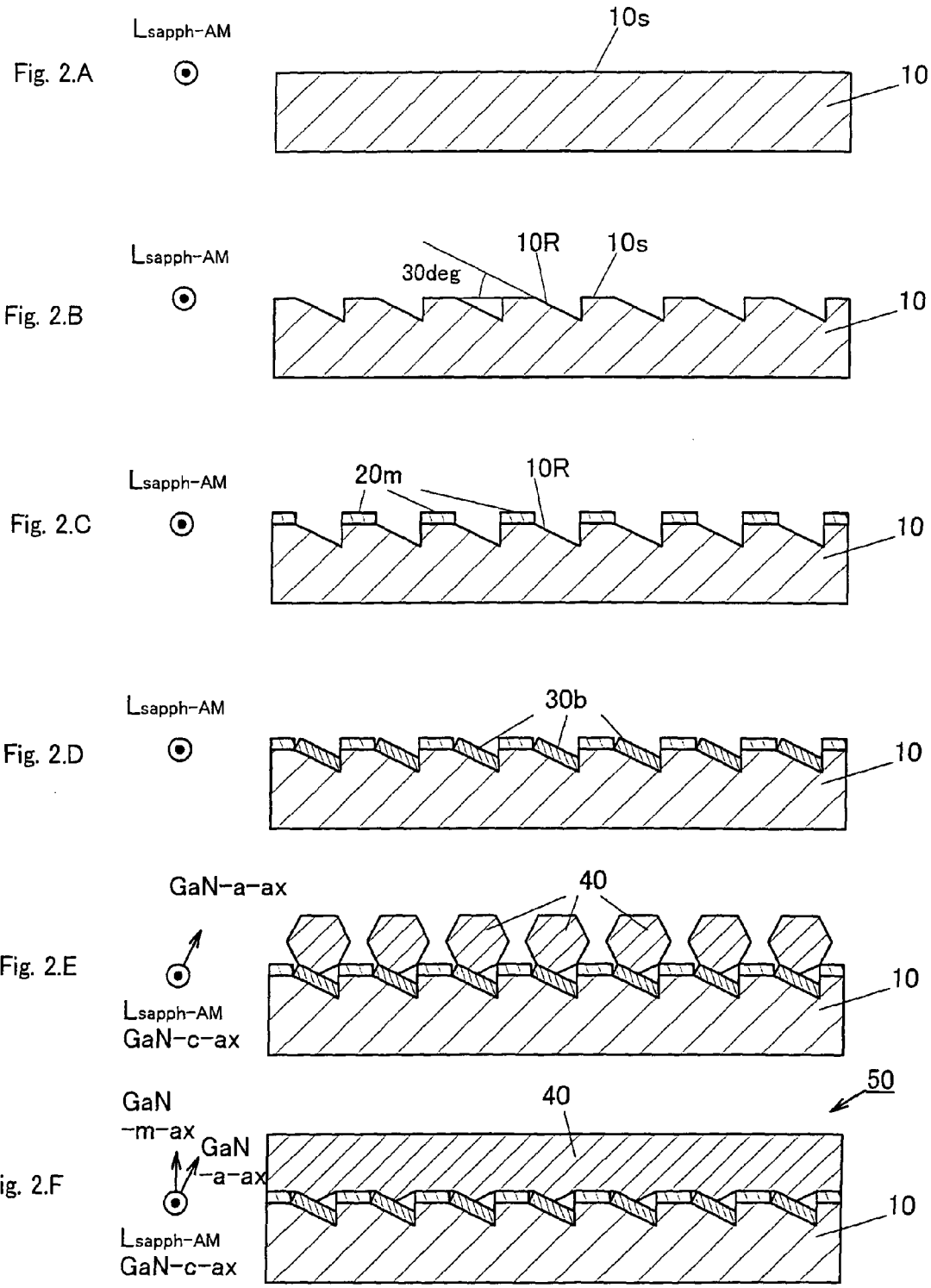

METHOD FOR PRODUCING GROUP III NITRIDE-BASED COMPOUND SEMICONDUCTOR, WAFER, AND GROUP III NITRIDE-BASED COMPOUND SEMICONDUCTOR DEVICE

BACKGROUND OF THE INVENTION

1. Field of the Invention

The present invention relates to a method for producing a Group III nitride-based compound semiconductor having a so-called wurtzite structure. More particularly, the present invention relates to a method for producing, through epitaxial growth, a Group III nitride-based compound semiconductor having an M-plane main surface. The present invention also relates to a Group III nitride-based compound semiconductor device including a wafer having an M-plane main surface, and a layer having an M-plane main surface. In a wurtzite structure (i.e., hexagonal crystal structure), M-plane is represented by a Miller index of (1-100). As used herein, the bar line which is conventionally provided above a component of a Miller index is denoted by the symbol provided immediately before the component.

As used herein, "Group III nitride-based compound semiconductor" encompasses a semiconductor represented by the formula $Al_xGa_yIn_{1-x-y}N$ ($0 \leq x \leq 1$, $0 \leq y \leq 1$, $0 \leq x+y \leq 1$); such a semiconductor containing a predetermined element so as to attain, for example, an n-type/p-type conduction; and such a semiconductor in which a portion of a Group III element is substituted by B or Tl, or a portion of the Group V element is substituted by P, As, Sb, or Bi.

2. Background Art

Group III nitride-based compound semiconductor light-emitting devices have been widely used, and many attempts have been made to improve characteristics of the devices. In general, a Group III nitride-based compound semiconductor light-emitting device is produced through epitaxial growth of a Group III nitride-based compound semiconductor on a substrate made of a material different from Group III nitride-based compound semiconductor (hereinafter the substrate may be referred to as a "hetero-substrate"); for example, a sapphire substrate. In a most common epitaxial growth process, a Group III nitride-based compound semiconductor is grown so that the thickness direction of the semiconductor is along the c-axis, and the semiconductor has a C-plane main surface.

As has been known, when, in a Group III nitride-based compound semiconductor light-emitting device, for example, layers having a multiple quantum well structure are stacked in a c-axis direction (i.e., the interface between stacked layers is parallel to C-plane), a piezoelectric field is generated by strain in the light-emitting device, and quantum efficiency is reduced. Generation of such a piezoelectric field attributed to internal strain is also undesirable in the case of formation of a device other than a light-emitting device (e.g., HEMT).

In view of the foregoing, attempts have been made to develop a technique for epitaxially growing a Group III nitride-based compound semiconductor so that the thickness direction of the semiconductor is not along the c-axis. Japanese Patent Application Laid-Open (kokai) No. 2006-036561 (filed by the present applicant) discloses a technique for preventing growth of a crystal in an undesirable growth axis direction through formation of a mask.

SUMMARY OF THE INVENTION

As has been well known, when a hetero-substrate is employed for epitaxial growth of a Group III nitride-based compound semiconductor, a limitation is imposed on the main surface of the hetero-substrate on which a Group III nitride-based compound semiconductor of good crystallinity is grown. Therefore, from an entirely new point of view, the present inventors have conceived a method for growing a Group III nitride-based compound semiconductor along a predetermined crystal axis along which no Group III nitride-based compound semiconductor is generally grown on the main surface of a hetero-substrate, and have accomplished the present invention.

In a first aspect of the present invention, there is provided a method for producing a Group III nitride-based compound semiconductor, comprising processing a main surface of a sapphire substrate, the main surface being inclined by 30° with respect to R-plane about a line of intersection formed by R-plane and A-plane perpendicular thereto, to thereby expose an R-plane surface which is inclined by 30° from the main surface; and epitaxially growing a Group III nitride-based compound semiconductor of interest primarily on the exposed R-plane surface of the sapphire substrate by the mediation of a buffer layer, so that the Group III nitride-based compound semiconductor has an A-plane surface parallel to the exposed R-plane surface of the sapphire substrate, to thereby form a Group III nitride-based compound semiconductor layer having an M-plane main surface parallel to the main surface of the sapphire substrate.

In a second aspect of the present invention, a surface of the sapphire substrate other than the exposed R-plane surface is covered with a masking material which does not permit epitaxial growth of a Group III nitride-based compound semiconductor thereon, and subsequently the Group III nitride-based compound semiconductor of interest is epitaxially grown on the R-plane surface by the mediation of a buffer layer.

In a third aspect of the present invention, the masking material is silicon dioxide.

In a fourth aspect of the present invention, the Group III nitride-based compound semiconductor of interest is epitaxially grown in a carrier gas atmosphere containing mainly nitrogen.

In a fifth aspect of the present invention, epitaxial growth of the Group III nitride-based compound semiconductor of interest is initiated in a carrier gas atmosphere containing mainly nitrogen and on its way of epitaxial growth the carrier gas is switched to that containing mainly hydrogen to continue epitaxial growth.

In a sixth aspect of the present invention, there is provided a wafer comprising a sapphire substrate having at least an exposed R-plane portion, and a Group III nitride-based compound semiconductor which has an M-plane main surface and is stacked on the sapphire substrate. As used herein, "exposed R-plane portion" of the sapphire substrate corresponds not to an exposed portion of the wafer, but to the interface between the sapphire substrate and the Group III nitride-based compound semiconductor.

In a seventh aspect of the present invention, there is provided a Group III nitride-based compound semiconductor device comprising a sapphire substrate having at least an exposed R-plane portion, and at least one layer of a Group III nitride-based compound semiconductor having an M-plane main surface. As used herein, "exposed R-plane portion" of the sapphire substrate corresponds not to an exposed portion of the device, but to the interface between the sapphire substrate and the Group III nitride-based compound semiconductor.

An eighth aspect of the present invention is drawn to a specific embodiment of the method for producing a Group III nitride-based compound semiconductor as described in any one of the first to fifth aspects of the invention, wherein the Group III nitride-based compound semiconductor of interest is epitaxially grown so as to have a total thickness of 50 μm or more, followed by cooling to room temperature, so that fracture at an M-plane surface in the Group III nitride-based compound semiconductor of interest occurs by stress attributed to the difference in thermal expansion coefficient between the sapphire substrate and the Group III nitride-based compound semiconductor of interest, to thereby separate at least the sapphire substrate.

As has been well known, a sapphire substrate of hexagonal crystal form has, for example, a (0001)-plane surface (i.e., C-plane surface), a (11-20)-plane surface (i.e., A-plane surface), a (1-100)-plane surface (i.e., M-plane surface), and a (1-102)-plane surface (i.e., R-plane surface). An R-plane surface is perpendicular to one A-plane surface, and a line of intersection formed by the R-plane surface and the A-plane surface is denoted by "$L_{Sapph-AM}$." As has been known, when a Group III nitride-based compound semiconductor is epitaxially grown on the R-plane surface of the sapphire substrate, A-plane of the Group III nitride-based compound semiconductor becomes parallel to the R-plane surface of the sapphire substrate. In this case, the c-axis of the Group III nitride-based compound semiconductor is parallel to the aforementioned line of intersection $L_{sapph-AM}$.

When a sapphire substrate whose main surface is inclined from R-plane by 30° is processed so that an R-plane surface thereof is exposed, and a Group III nitride-based compound semiconductor is epitaxially grown on the exposed R-plane surface, A-plane of the thus-grown Group III nitride-based compound semiconductor becomes parallel to the R-plane surface of the sapphire substrate. In this case, when the main surface of the sapphire substrate is inclined by 30° with respect to R-plane about a line of intersection $L_{sapph-AM}$ formed by R-plane and A-plane perpendicular thereto, since the c-axis of the Group III nitride-based compound semiconductor is parallel to the line $L_{sapph-AM}$, M-plane of the Group III nitride-based compound semiconductor becomes the main surface of the sapphire substrate, which is inclined by 30° from the R-plane surface thereof.

When a Group III nitride-based compound semiconductor layer of interest is stacked on a Group III nitride-based compound semiconductor layer obtained through the production method of the present invention, in the thus-formed layered structure, the interface between the Group III nitride-based compound semiconductor layers is M-plane. Thus, the present invention facilitates formation of a Group III nitride-based compound semiconductor device (in particular, a Group III nitride-based compound semiconductor light-emitting device) in which a piezoelectric field attributed to internal strain is not generated (first aspect).

A semiconductor crystal obtained through the technique disclosed in Japanese Patent Application Laid-Open (kokai) No. 2006-036561 poses problems in terms of co-presence of ±C-plane crystals, and poor surface flatness due to the difference in growth rate between a +c-axis direction and a −c-axis direction. In contrast, the Group III nitride-based compound semiconductor produced through the method of the present invention exhibits good crystallinity and flatness, since the lateral growth surface of the semiconductor is not C-plane.

It has been found that a Group III nitride-based compound semiconductor of good crystallinity fails to be formed on a surface of a sapphire substrate which is inclined by 30° with respect to R-plane about a line of intersection $L_{sapph-AM}$ formed by R-plane and A-plane perpendicular thereto, even when a buffer layer is provided on the substrate surface.

However, from the viewpoint of prevention of growth of miscellaneous crystals, more preferably, a surface of the sapphire substrate other than an R-plane surface is covered with a masking material which does not permit epitaxial growth of a Group III nitride-based compound semiconductor thereon (second aspect).

Preferably, the masking material is silicon dioxide (third aspect). However, the masking material may be a predetermined material such as silicon nitride.

Epitaxial growth on an exposed R-plane surface of the sapphire substrate only in a vertical direction may fail to sufficiently form a surface parallel to the main surface of the sapphire substrate. Therefore, preferably, epitaxial growth of a Group III nitride-based compound semiconductor is carried out under so-called lateral growth conditions until the top surface of the sapphire substrate is entirely covered with the semiconductor. In this case, nitrogen is preferably employed as a carrier gas, but lateral growth conditions do not include use of a carrier gas containing no hydrogen (fourth aspect). The essentials of the present invention are achieved only through lateral growth of a Group III nitride-based compound semiconductor having an M-plane main surface. However, in order to promote rapid growth of the semiconductor of good crystallinity after lateral growth, preferably, the carrier gas employed above is replaced with a carrier gas containing mainly hydrogen (fifth aspect).

The present invention has first realized a wafer including a sapphire substrate having an exposed R-plane portion, and a Group III nitride-based compound semiconductor which has an M-plane main surface and is stacked on the sapphire substrate (sixth aspect).

Also, the present invention has first realized a Group III nitride-based compound semiconductor device including a sapphire substrate having an exposed R-plane portion, and at least one layer of a Group III nitride-based compound semiconductor which has an M-plane main surface and is formed on the sapphire substrate (seventh aspect).

When the Group III nitride-based compound semiconductor of interest is epitaxially grown so as to have a total thickness of 50 μm or more, followed by cooling to room temperature, fracture at an M-plane surface in the Group III nitride-based compound semiconductor of interest occurs by stress attributed to the difference in thermal expansion coefficient between the sapphire substrate and the Group III nitride-based compound semiconductor of interest, whereby at least the sapphire substrate can be separated (eighth aspect). When the total thickness of the Group III nitride-based compound semiconductor is less than 50 μm, after the Group III nitride-based compound semiconductor has been separated from the sapphire substrate, the semiconductor fails to have such a thickness that allows it to be handled as, for example, a substrate for epitaxial growth. The total thickness is preferably 100 μm or more, more preferably 200 μm or more.

When cooling is carried out at an excessively high rate, temperature difference arises in the Group III nitride-based compound semiconductor, which causes cracking. The cooling rate is preferably 100 degrees (° C.)/minute to 0.5 degrees (° C.)/minute, more preferably 50 degrees (° C.)/minute to 2 degrees (° C.)/minute.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIG. 2 shows a specific embodiment of the present invention; i.e., steps of a method for producing a Group III nitride-based compound semiconductor 40 (cross-sectional views).

DETAILED DESCRIPTION OF PREFERRED EMBODIMENTS

Figure 1C:
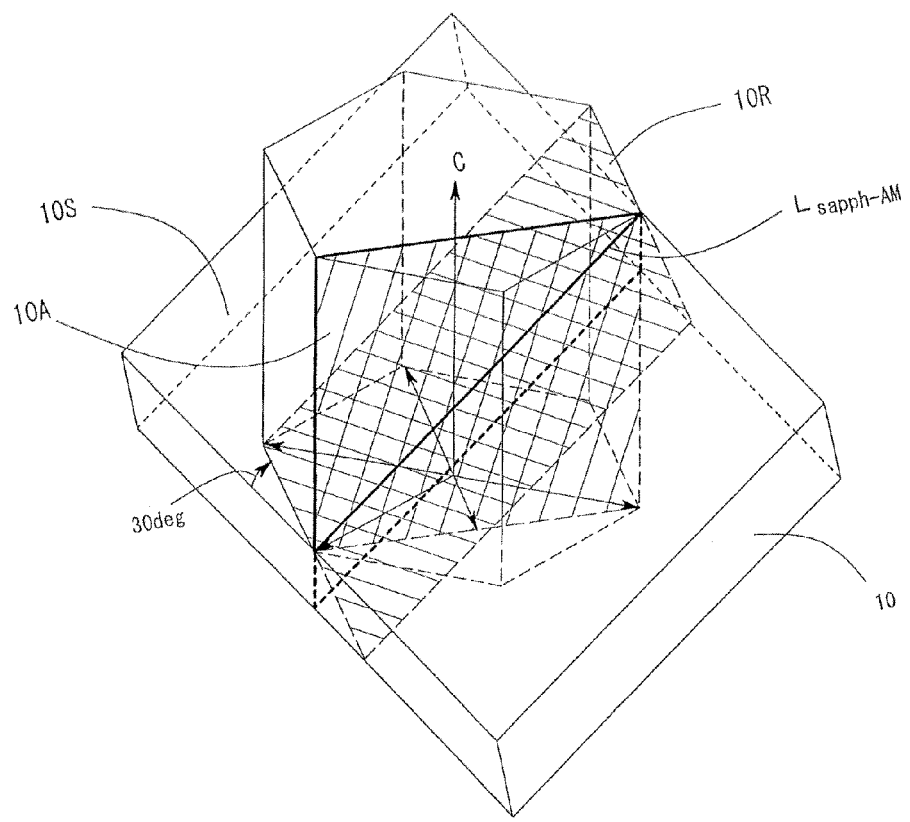
FIG. 1 shows a sapphire substrate 10 having a main surface 10s which is inclined by 30° with respect to an R-plane surface 10R about a line of intersection $L_{sapph-AM}$ formed by the R-plane surface 10R and an A-plane surface 10A perpendicular thereto (two schematic representations)

In the present invention, dry etching (e.g., ICP etching) or wet etching employing hot phosphoric acid/hot sulfuric acid may be employed in a step of processing a sapphire substrate whose main surface is inclined by 30° with respect to R-plane about a line of intersection formed by R-plane and A-plane perpendicular thereto, to thereby expose an R-plane surface which is inclined by 30° from the main surface.

During epitaxial growth of a Group III nitride-based compound semiconductor, preferably, a surface of the sapphire substrate other than the R-plane surface is masked with silicon oxide or silicon nitride serving as a masking material. The mask may be formed through a well known photolithography technique.

A buffer layer provided on the substrate is typically formed from AlN or GaN through low-temperature growth (600° C. or lower) employing so-called MOCVD. However, the buffer layer may have a ternary composition of AlGaN, or may be formed of an In-containing layer. Alternatively, the buffer layer may be formed of multiple layers having different compositions. Such a buffer layer may be formed through any known technique.

Epitaxial growth of the Group III nitride-based compound semiconductor may be carried out through so-called MOCVD employing, for example, ammonia and a trimethyl compound of a Group III element, or through HVPE employing a halide of a Group III element. For example, MOCVD may be employed at an initial stage of epitaxial growth of the Group III nitride-based compound semiconductor, and MOCVD may be replaced with HVPE after the top surface of the sapphire substrate has been entirely covered with the semiconductor.

Any other known technique may be employed without departing from the gist of the present invention.

Next will be described embodiments in which a GaN layer is formed as a Group III nitride-based compound semiconductor having an M-plane main surface. However, the method of the present invention is also applicable to production of a Group III nitride-based compound semiconductor having a predetermined composition.

Embodiment 1

FIG. 1 (two schematic representations) shows a sapphire substrate 10 employed in the present invention, the substrate 10 having a main surface 10s which is inclined by 30° with respect to an R-plane surface 10R about a line of intersection $L_{sapph-AM}$ formed by the R-plane surface 10R and an A-plane surface 10A perpendicular thereto.

FIG. 1A shows a common hexagonal crystal having four lattice vectors a1, a2, a3, and c indicated by thick arrows. As shown in FIG. 1A, one R-plane surface 10R is hatched from upper left to lower right; an A-plane surface 10A perpendicular to the R-plane surface 10R is hatched from upper right to lower left; and a line of intersection $L_{sapph-AM}$ formed by the R-plane surface 10R and the A-plane surface 10A is indicated by a thick line. In FIG. 1A, all the edges of a hexagonal unit cell are shown by broken lines, except that four segments defining the R-plane surface 10R or the A-plane surface 10A are shown by solid lines.

In FIG. 1A, the R-plane surface 10R is represented by a Miller index of (1-102); i.e., the reciprocals of points where the surface 10R intersects with the lattice axes a1, a2, a3, and c. The A-plane surface 10A is represented by a Miller index of (11-20); i.e., the reciprocals of points where the surface 10A intersects with the lattice axes a1, a2, a3, and c. The line $L_{sapph-AM}$ is parallel to the sum of the lattice vectors -a1, a2, and c, and is represented by a Miller index of [-1101].

FIG. 1B shows a sapphire substrate 10 having a main surface 10s which is inclined by 30° with respect to the R-plane surface 10R shown in FIG. 1A about the line $L_{sapph-AM}$. As shown in FIG. 1B, the R-plane surface 10R of the sapphire substrate 10 is not exposed and is indicated by a hatched rectangle defined by broken lines. A surface (other than the R-plane surface 10R) inclined by 30° with respect to the main surface 10s about the line $L_{sapph-AM}$ is not illustrated in FIG. 1B. The non-illustrated surface is not an R-plane surface of the sapphire substrate and is irrelevant to the present invention.

FIG. 1C shows the hexagonal crystal in FIG. 1B when is rotated so as to be erected as shown in FIG. 1A.

Figure 1D:
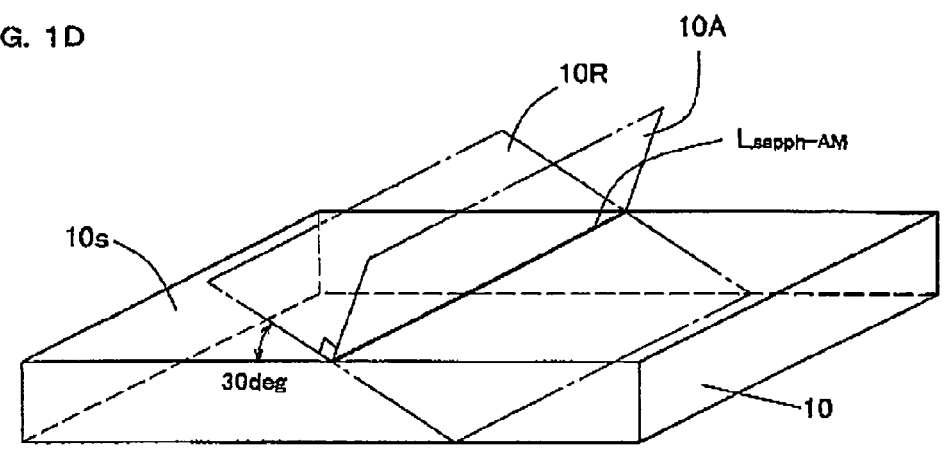

FIG. 1D shows the main surface 10s inclined by 30° with respect to the R-plane surface 1 OR about the line of intersection $L_{sapph-AM}$ formed by the R-plane surface 10R and the A-plane surface 10A perpendicular thereto.

FIG. 2 (six cross-sectional views) shows an embodiment of the present invention; i.e., steps of a production method employing the sapphire substrate 10 shown in FIG. 1B, which has the main surface 10s inclined by 30° with respect to the R-plane surface 10R about the line of intersection $L_{sapph-AM}$ formed by the R-plane surface 10R and the A-plane surface 10A perpendicular thereto.

As shown in, for example, FIG. 2A, each cross-sectional view of FIG. 2 is provided with line of intersection $L_{sapph-AM}$ shown in FIG. 1B, which line is perpendicular to the sheet plane of FIG. 2.

Firstly, R-plane surfaces 10R shown in FIG. 1B are exposed through a known technique. Each of the R-plane surfaces 10R is inclined by 30° from the main surface 10s of the sapphire substrate 10 (FIG. 2B) (hereinafter such an R-plane surface 10R inclined by 30° from the main surface 10s may be referred to as an "accurate R-plane surface 10R"). The below-described epitaxial growth may be carried out on a surface other than an accurate R-plane surface 10R; for example, a surface which is inclined from an accurate R-plane surface 10R by an angle within a range of ±2°. Preferably, epitaxial growth is carried out on a surface which is inclined from an accurate R-plane surface 10R by an angle within a range of ±0.5°.

In this case, from the viewpoint of effectiveness, the R-plane surfaces 11R are exposed so that the exposed surfaces are arranged in a parallel stripe form as viewed from above. Five R-plane surfaces (other than the R-plane surface 10R) of the sapphire substrate 10 are not parallel to the line $L_{sapph-AM}$ shown in FIGS. 2A to 2F. Therefore, it is not preferred that these five R-plane surfaces are exposed and the R-plane surface 10R shown in FIG. 1B is not exposed, from the viewpoint of intricate arrangement and processing.

Exposure of such stripe-form surfaces is preferably carried out so that, for example, the exposed surfaces have a width of 3 µm, and the non-processed portions have a width of about 3 µm. If desired, the sapphire substrate may be appropriately processed so that the exposed surfaces or the non-processed portions have a width falling within a range of 0.5 to 20 µm.

Subsequently, a silicon dioxide mask 20m is formed on the main surface 10s of the thus-processed sapphire substrate 10 (FIG. 2C). The mask may be formed through any known photolithography technique.

Thereafter, AlN buffer layers 30b are formed on the exposed R-plane surfaces 11R of the sapphire substrate 10 at 600° C. or lower. The buffer layers may be formed through, for example, MOCVD. In this case, the AlN buffer layers 30b are not formed on the silicon dioxide mask 20m (FIG. 2D).

Then, a GaN layer 40 is formed on the AlN buffer layers 30b (FIGS. 2E and 2F). GaN is grown through MOCVD. At an initial stage, preferably, lateral growth is promoted in a crystal growth apparatus by use of nitrogen serving as a carrier gas under reduced pressure (50 to 250 torr). After the top surface of the sapphire substrate 10 has been entirely covered with the GaN layer, preferably, the nitrogen carrier gas is replaced with hydrogen, and the pressure in the apparatus is returned to ambient pressure.

In this case, the GaN layer 40 is epitaxially grown so that the a-axis of the GaN layer 40 (GaN-a-ax shown in FIGS. 2E and 2F) is perpendicular to the exposed R-plane surfaces of the sapphire substrate 10, and so that the c-axis of the GaN layer 40 (GaN-c-ax shown in FIGS. 2E and 2F) is parallel to the axis direction $L_{sapph\text{-}AM}$ of the sapphire substrate 10. Thus, the GaN layer 40 is grown so that the m-axis of the GaN layer 40 (GaN-m-ax shown in FIG. 2F), which is inclined by 30° from the a-axis of the GaN layer 40, is perpendicular to the main surface 10s (inclined by 30° from the exposed R-plane surfaces) of the sapphire substrate 10. That is, the thus-grown GaN layer 40 (shown in FIG. 2F) has an M-plane main surface. FIG. 2F shows a wafer 50 including the sapphire substrate 10 having at least the exposed R-plane surfaces 10R, and the Group III nitride-based compound semiconductor (GaN layer 40) which has an M-plane main surface and is stacked on the sapphire substrate 10. Provision of a Group III nitride-based compound semiconductor layer having a predetermined composition on the wafer 50 can produce a Group III nitride-based compound semiconductor device in which the interface between the semiconductor layers is M-plane, and a piezoelectric field is not generated in a thickness direction.

Modification

The procedure of Embodiment 1 was repeated, except that a silicon dioxide mask 20m was not provided, to thereby form a gallium nitride layer. Through observation of the cross section of the layer, vertical growth on the main surface 10s of the sapphire substrate 10 was not detected. This indicates that, without provision of a mask, the gallium nitride layer is formed through lateral growth so as to cover the main surface 10s of the sapphire substrate 10.

Embodiment 2

A thick gallium nitride (GaN) layer was formed on the wafer 50 obtained in Embodiment 1, which includes the sapphire substrate 10 having at least the exposed R-plane surfaces 10R, and the GaN layer 40 having a flat M-plane main surface.

Specifically, a GaN layer (thickness: 300 µm) was epitaxially grown on the GaN layer 40 (having a flat M-plane main surface) of the wafer 50 through HVPE (substrate temperature: 1,050° C.) employing a hydrogen carrier gas under supply of hydrogen chloride (50 sccm) and ammonia (2 SLM). Thereafter, when the resultant product was cooled to room temperature at a cooling rate of 10 degrees (° C.)/minute, the sapphire substrate 10 having at least the exposed R-plane surfaces 10R was separated from the product together with the AlN buffer layers 30b and a thin GaN layer. In this case, separation occurred at an M-plane surface in the GaN layer 40, and the separation surface was found to be very flat. No cracking was observed in the thus-obtained thick GaN substrate.

Even in the case where a GaN layer is formed through both MOCVD and HVPE, when the GaN layer has a total thickness of 50 µm or more, a GaN substrate having no cracks is produced. From the viewpoint of easy handling, the GaN layer is required to have a thickness of 200 µm or more (more preferably 300 µm or more).

This requirement is also applied to the case where a thick layer is formed from a Group III nitride-based compound semiconductor other than GaN.

What is claimed is:

1. A method for producing a Group III nitride-based semiconductor, said method comprising:
   providing a main surface of a sapphire substrate, wherein an angle between the main surface and an R-plane (1-102) of a sapphire is 30° and a line of intersection formed by the R-plane (1-102) and an A-plane (11-20) of the sapphire exists on the main surface, the A-plane (11-20) being perpendicular to the R-plane (1-102), and a direction of the line being a [−1101] direction of the sapphire;
   forming a groove on the main surface, which comprises a stripe-form extending along the line and an exposed side surface which comprises the R-plane (1-102); and
   epitaxially growing a Group III nitride-based compound semiconductor of interest primarily on the exposed side surface of the R-plane (11-20) by a mediation of a buffer layer, so that the Group III nitride-based compound semiconductor comprises an A-plane surface parallel to the exposed side surface of the groove, to thereby form a Group III nitride-based compound semiconductor layer comprising an M-plane (1-100) main surface parallel to the main surface of the sapphire substrate.

2. A method for producing a Group III nitride-based compound semiconductor according to claim 1, wherein a surface of the sapphire substrate other than the exposed side surface of the R-plane (11-20) is covered with a masking material which does not permit epitaxial growth of a Group III nitride-based compound semiconductor thereon, and subsequently the Group III nitride-based compound semiconductor of interest is epitaxially grown on the exposed side surface of the R-plane (11-20) by the mediation of a buffer layer.

3. A method for producing a Group III nitride-based compound semiconductor according to claim 2, wherein the masking material comprises silicon dioxide.

4. A method for producing a Group III nitride-based compound semiconductor according to claim 3, wherein the Group III nitride-based compound semiconductor of interest is epitaxially grown in a carrier gas atmosphere that comprises mainly nitrogen.

5. A method for producing a Group III nitride-based compound semiconductor according to claim 4, wherein the Group III nitride-based compound semiconductor of interest is epitaxially grown so as to have a total thickness of 50 µm or more, followed by cooling to room temperature, so that a fracture at an M-plane surface in the Group III nitride-based compound semiconductor of interest occurs by stress attributed to a difference in thermal expansion coefficients between the sapphire substrate and the Group III nitride-based compound semiconductor of interest, to thereby separate at least the sapphire substrate.

6. A method for producing a Group III nitride-based compound semiconductor according to claim 3, wherein epitaxial growth of the Group III nitride-based compound semiconductor of interest is initiated in a carrier gas atmosphere that comprises mainly nitrogen and on its way of epitaxial growth the carrier gas is switched to comprise mainly hydrogen to continue epitaxial growth.

7. A method for producing a Group III nitride-based compound semiconductor according to claim 6, wherein the Group III nitride-based compound semiconductor of interest is epitaxially grown so as to have a total thickness of 50 μm or more, followed by cooling to room temperature, so that a fracture at an M-plane surface in the Group III nitride-based compound semiconductor of interest occurs by stress attributed to a difference in thermal expansion coefficients between the sapphire substrate and the Group III nitride-based compound semiconductor of interest, to thereby separate at least the sapphire substrate.

8. A method for producing a Group III nitride-based compound semiconductor according to claim 3, wherein the Group III nitride-based compound semiconductor of interest is epitaxially grown so as to have a total thickness of 50 μm or more, followed by cooling to room temperature, so that a fracture at an M-plane surface in the Group III nitride-based compound semiconductor of interest occurs by stress attributed to a difference in thermal expansion coefficients between the sapphire substrate and the Group III nitride-based compound semiconductor of interest, to thereby separate at least the sapphire substrate.

9. A method for producing a Group III nitride-based compound semiconductor according to claim 2, wherein the Group III nitride-based compound semiconductor of interest is epitaxially grown in a carrier gas atmosphere that comprises mainly nitrogen.

10. A method for producing a Group III nitride-based compound semiconductor according to claim 9, wherein the Group III nitride-based compound semiconductor of interest is epitaxially grown's° as to have a total thickness of 50 μm or more, followed by cooling to room temperature, so that a fracture at an M-plane surface in the Group III nitride-based compound semiconductor of interest occurs by stress attributed to a difference in thermal expansion coefficients between the sapphire substrate and the Group III nitride-based compound semiconductor of interest, to thereby separate at least the sapphire substrate.

11. A method for producing a Group III nitride-based compound semiconductor according to claim 2, wherein epitaxial growth of the Group III nitride-based compound semiconductor of interest is initiated in a carrier gas atmosphere that comprises mainly nitrogen and on its way of epitaxial growth the carrier gas is switched to comprise mainly hydrogen to continue epitaxial growth.

12. A method for producing a Group III nitride-based compound semiconductor according to claim 11, wherein the Group III nitride-based compound semiconductor of interest is epitaxially grown so as to have a total thickness of 50 μm or more, followed by cooling to room temperature, so that a fracture at an M-plane surface in the Group III nitride-based compound semiconductor of interest occurs by stress attributed to a difference in thermal expansion coefficients between the sapphire substrate and the Group III nitride-based compound semiconductor of interest, to thereby separate at least the sapphire substrate.

13. A method for producing a Group III nitride-based compound semiconductor according to claim 2, wherein the Group III nitride-based compound semiconductor of interest is epitaxially grown so as to have a total thickness of 50 μm or more, followed by cooling to room temperature, so that a fracture at an M-plane surface in the Group III nitride-based compound semiconductor of interest occurs by stress attributed to a difference in thermal expansion coefficients between the sapphire substrate and the Group III nitride-based compound semiconductor of interest, to thereby separate at least the sapphire substrate.

14. A method for producing a Group III nitride-based compound semiconductor according to claim 1, wherein the Group III nitride-based compound semiconductor of interest is epitaxially grown in a carrier gas atmosphere that comprises mainly nitrogen.

15. A method for producing a Group III nitride-based compound semiconductor according to claim 14, wherein the Group III nitride-based compound semiconductor of interest is epitaxially grown so as to have a total thickness of 50 μm or more, followed by cooling to room temperature, so that a fracture at an M-plane surface in the Group III nitride-based compound semiconductor of interest occurs by stress attributed to a difference in thermal expansion coefficients between the sapphire substrate and the Group III nitride-based compound semiconductor of interest, to thereby separate at least the sapphire substrate.

16. A method for producing a Group III nitride-based compound semiconductor according to claim 1, wherein epitaxial growth of the Group III nitride-based compound semiconductor of interest is initiated in a carrier gas atmosphere that comprises mainly nitrogen and on its way of epitaxial growth the carrier gas is switched to comprise mainly hydrogen to continue epitaxial growth.

17. A method for producing a Group III nitride-based compound semiconductor according to claim 16, wherein the Group III nitride-based compound semiconductor of interest is epitaxially grown so as to have a total thickness of 50 μm or more, followed by cooling to room temperature, so that a fracture at an M-plane surface in the Group III nitride-based compound semiconductor of interest occurs by stress attributed to a difference in thermal expansion coefficients between the sapphire substrate and the Group III nitride-based compound semiconductor of interest, to thereby separate at least the sapphire substrate.

18. A method for producing a Group III nitride-based compound semiconductor according to claim 1, wherein the Group III nitride-based compound semiconductor of interest is epitaxially grown so as to have a total thickness of 50 μm or more, followed by cooling to room temperature, so that a fracture at an M-plane surface in the Group III nitride-based compound semiconductor of interest occurs by stress attributed to a difference in thermal expansion coefficients between the sapphire substrate and the Group III nitride-based compound semiconductor of interest, to thereby separate at least the sapphire substrate.

19. A wafer, comprising:
a sapphire substrate comprising a main surface, wherein an angle between the main surface and an R-plane (1-102) of a sapphire is 30° and a line of intersection formed by the R-plane (1-102) and an A-plane (11-20) of the sapphire exists on the main surface, the A-plane (11-20) being perpendicular to the R-plane (1-102), and a direction of the line being a [−1101] direction of the sapphire;
a groove formed on the main surface, which comprises a stripe-form extending along the line and an exposed side surface which comprises the R-plane (1-102); and a Group III nitride-based compound semiconductor grown on the exposed side surface of the R-plane (11-20) by a mediation of a buffer layer, such that the Group III nitride-based compound semiconductor comprises an A-plane surface parallel to the exposed side surface of the groove, to thereby form a Group III nitride-based compound semiconductor layer comprising an M-plane (1-100) main surface parallel to the main surface of the sapphire substrate.

20. A Group III nitride-based compound semiconductor device, comprising:
    a sapphire substrate comprising a main surface, wherein an angle between the main surface and an R-plane (1-102) of a sapphire is 30° and a line of intersection formed by the R-plane (1-102) and an A-plane (11-20) of the sapphire exists on the main surface, the A-plane (11-20) being perpendicular to the R-plane (1-102), and a direction of the line being a [−1101] direction of the sapphire;
    a groove formed on the main surface, which comprises a stripe-form extending along the line and an exposed side surface which comprises the R-plane (1-102); and
    at least one layer of a Group III nitride-based compound semiconductor grown on the exposed side surface of the R-plane (11-20) by a mediation of a buffer layer, such that the Group III nitride-based compound semiconductor comprises an A-plane surface parallel to the exposed side surface of the wove, to thereby form a Group III nitride-based compound semiconductor layer comprising an M-plane (1-100) main surface parallel to the main surface of the sapphire substrate.

* * * * *